(12) United States Patent
Nakanishi et al.

(10) Patent No.: US 6,828,877 B2
(45) Date of Patent: Dec. 7, 2004

(54) FILTER USING MICRO-MECHANICAL RESONATOR

(75) Inventors: Yoshito Nakanishi, Tokyo (JP); Kunihiko Nakamura, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/355,434

(22) Filed: Jan. 31, 2003

(65) Prior Publication Data

US 2004/0080382 A1 Apr. 29, 2004

(30) Foreign Application Priority Data

Feb. 1, 2002 (JP) .......................................... 2002-025145
Jan. 16, 2003 (JP) .......................................... 2003-008001

(51) Int. Cl.[7] .............................. H03H 9/46; H03H 9/48
(52) U.S. Cl. ........................ 333/186; 333/197; 333/200
(58) Field of Search ................................. 333/197–200, 333/186

(56) References Cited

U.S. PATENT DOCUMENTS 5,447,601 A * 9/1995 Norris ............................. 216/2
6,249,073 B1 * 6/2001 Nguyen et al. ............. 310/309
6,369,374 B1 * 4/2002 Greywall ................... 250/201.1
6,557,419 B1 * 5/2003 Herb et al. ..................... 73/766
6,628,177 B2 * 9/2003 Clark et al. .................. 333/186

FOREIGN PATENT DOCUMENTS

JP          05-327393          12/1993

OTHER PUBLICATIONS

"High–Q HF Microelectromechanical Filters" by Frank D. Bannon et al., pp. 512–526, *IEEE Journal of Solid–State Circuits*, vol. 35, No. 4, Apr. 2000.

* cited by examiner

Primary Examiner—Barbara Summons
(74) Attorney, Agent, or Firm—RatnerPrestia

(57) ABSTRACT

An electric signal fed into a line generates electric field in response to its frequency, and a resonator placed closely to the line and in a substantially vacuum condition not higher than 100 pascal is excited by electrostatic force of the electric field and vibrates. Detecting means converts mechanical vibrations of the resonator into a signal in another form than the electric signal, then it detects the vibrations. The foregoing structure allows the resonator to be a micro-body and to process properly a high-frequency input signal of MHz or GHz band. A tight space between an input side and an output side does not permit an electric signal fed into the line to couple directly to the output side, and the resonator downsized to a micro-body is not subject to viscosity of air.

24 Claims, 13 Drawing Sheets step1 step1 step2 step2 step3 step3 step4 step4 step5 step5

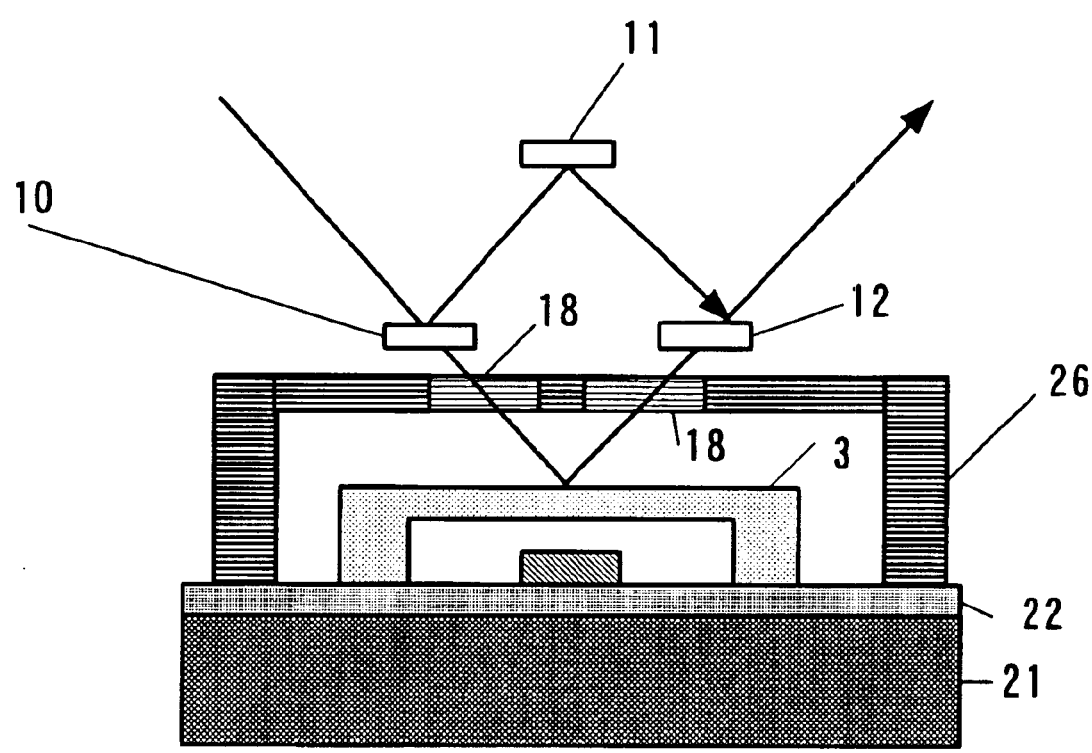
F I G. 3

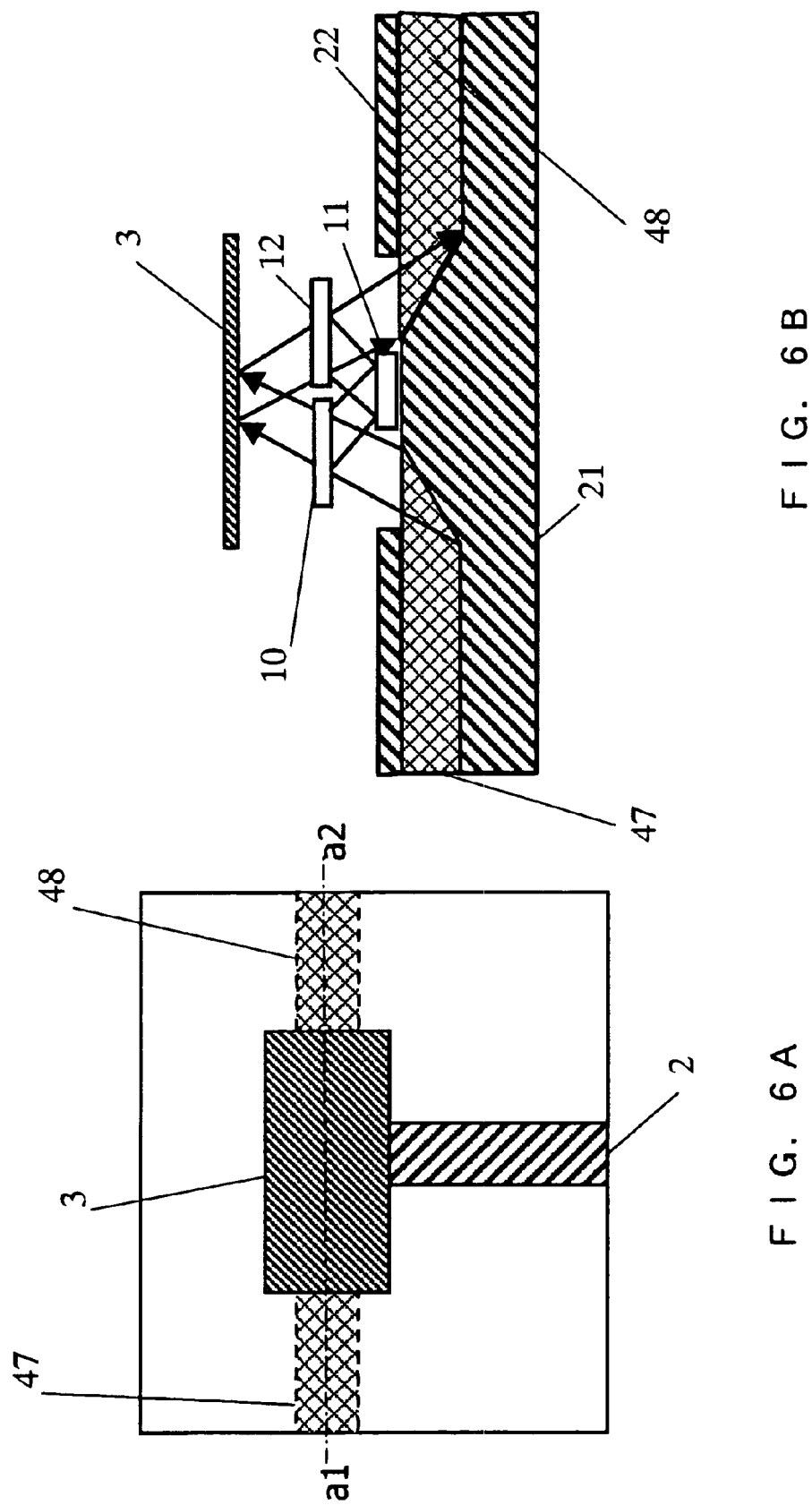

FILTER USING MICRO-MECHANICAL RESONATOR

FIELD OF THE INVENTION

The present invention relates to filters used in radio communication circuits. More particularly it relates to filters that convert mechanical vibrations into an output signal at frequencies of MHz band or GHz band, where resonators having a size of μm order are used. This micro-mechanical resonator is excited by an input signal having a frequency around the resonance frequency of the resonator, thereby producing the fine mechanical vibrations to be converted by this filter to the output signal.

BACKGROUND OF THE INVENTION

A conventional filter is disclosed in IEEE Journal of solid-state circuits, Vol. 35 No. 4, April 2000, issue. FIG. 11 shows a structure of a conventional filter that is formed on substrate 90. This filter comprises input line 94, output line 95, two resonators 91, 92 of which both ends are fixed to substrate 90 slightly spaced from lines 94 and 95, having an identical resonance frequency, and coupling beam 93 that couples the two resonators.

A signal fed into input line 94 generates electric field responsive to the frequency of the signal and applies electrostatic force to resonator 91. At this time, when the frequency of the input signal generally agrees with the resonance frequency of resonator 91, resonator 91 is excited to vibrate, and resonator 92 coupled to resonator 91 with beam 93 also vibrates.

As such, only a signal having a frequency generally agreeing with the resonance frequency of resonators 91, 92 is selectively converted from an electric signal to mechanical vibrations. Then the mechanical signal is converted again to an electric signal between resonator 92 and output line 95. This is an inverse conversion to the conversion from the electric signal to the mechanical signal done between input line 94 and resonator 92.

The foregoing structure can work as a filter such that among signals fed into the input line, only the signals having a frequency generally agreeing with the resonance frequency of resonator 91, 92 are allowed to pass through output line 95. Resonance frequency "f0" of resonator 91 is expressed with the equation below:

$$f_0 = \frac{1}{2\pi}\sqrt{\frac{k}{m}}$$

where resonance frequency f0 is a function of mass "m" of resonator 91 and spring constant "k". A similar equation is applicable to resonator 92.

Another conventional filter is disclosed in Japanese Patent Application Non-examined Publication No. H05-327393. This filter receives an unprocessed signal at an excitation coil, and oscillatory-wave components, of which frequency generally agrees with the resonance frequency of the resonators, are extracted out of the oscillatory waves of the unprocessed signal. This extraction is carried out by launching light from a fixed scale to a variable scale disposed at an oscillator, and changes of the power of the reflected light is extracted. As a result, this filter allows only the frequency resonant with the oscillator to pass through.

In order to work the conventional filters discussed above at frequencies of MHz band or GHz band, the mass of the resonators should be micro-miniaturized, which naturally requires the filter per se to be downsized to a micro-body.

For instance, FIG. 12 shows relations between resonance frequencies and lengths of resonators in the case of scaling down resonators 91, 92 of the conventional filter shown in FIG. 11. Resonators 91, 92 are actually 40 μm long and 3 μm wide, and those dimensions are scaled down with the same ratio.

In order to use this conventional filter as a device in the mobile communication field where a frequency band ranging of 1 GHz-5 GHz holds great promise to use this kind of filters, the length should be shortened to 0.04 μm from 0.2 μm. The relative distance between input line 94 and output line 95 placed via resonators 91, 92 is naturally required to be shorter.

As a result, in the conventional filter, input line 94 is placed closer to output line 95, and they make a direct coupling between them, so that the isolation lowers and the filter does not work properly.

FIG. 13A shows isolation characteristics of a filter having no direct coupling between an input line and an output line. FIG. 13B shows isolation characteristics of a filter where a coupling of 0.1 μm space between an input signal and an output line is produced. In the case where the frequency is so low that a width between input line 94 and the output line 95 can be prepared wide enough to neglect a coupling between the two lines, the filter can work properly as shown in FIG. 13A. However, as the available frequency becomes higher, the resonator becomes smaller, and when input line 94 is directly coupled to output line 95, isolation in the frequencies higher than the resonance frequency greatly lowers as shown in FIG. 13B. As a result, the filter cannot work properly. On the other hand, in the frequencies lower than the resonance frequency, a capacitance generated between input line 94 and output line 95 resonates with an inductance component of the resonator, thereby sometimes producing unnecessary notches.

The filter in which input line 94 is placed close to output line 95 can be downsized to a micro-body process-wise; in fact, a direct coupling between the two lines degrades the filter characteristics, and the filter thus cannot be used in high frequencies such as MHz band or GHz band.

A filter used in high frequencies such as MHz band or GHz band includes resonators of micro-body of μm order, so that its oscillators (resonators) are hard to oscillate properly due to the viscosity of air.

SUMMARY OF THE INVENTION

The present invention addresses the problems discussed above and aims to provide a filter free from characteristics degradation due to a direct coupling between an input line and an output line in high frequencies such as MHz band or GHz band. Further the filter of the present invention includes a resonator not influenced by the viscosity of air.

The filter of the present invention comprises the following elements:

a line through which an electric signal is input;

a resonator, disposed closely to the line and in vacuum, for resonating by applying electrostatic force of electric field generated responsive to a frequency of the electric signal; and detecting means for detecting mechanical vibrations of the resonator.

The detecting means detects mechanical vibrations as a signal in another form than the electric signal.

Since the input electric signal is output in another form, this structure does not permit an input electric signal to be directly coupled to an output side. Even if an input side is placed immediately close to an output side because the resonator is downsized to a micro-body in high frequencies such as MHz band or GHz band. Further the resonator works in the vacuum, the resonator of a micro-body is not influenced by the viscosity of air, and micro-mechanical vibrations of the resonator can be converted into an appropriate signal before being detected. The vacuum referred in the present invention includes a true vacuum condition and a substantially vacuum condition not more than 100 pascal.

BRIEF DESCRIPTION OF THE DRAWINGS

FIG. 3 shows a sectional view illustrating the resonator in accordance with the first exemplary embodiment housed in an airtight package.

FIG. 6A shows a top view illustrating a schematic structure of a filter in accordance with a third exemplary embodiment.

FIG. 6B shows a sectional view illustrating a schematic structure of the filter in accordance with the third embodiment.

DETAILED DESCRIPTION OF THE INVENTION

Exemplary embodiments of the present invention are demonstrated hereinafter with reference to the accompanying drawings. The vacuum referred in the embodiments includes true vacuum and a substantially vacuum condition not more than 100 pascal.

Exemplary Embodiment 1

Figure 1:
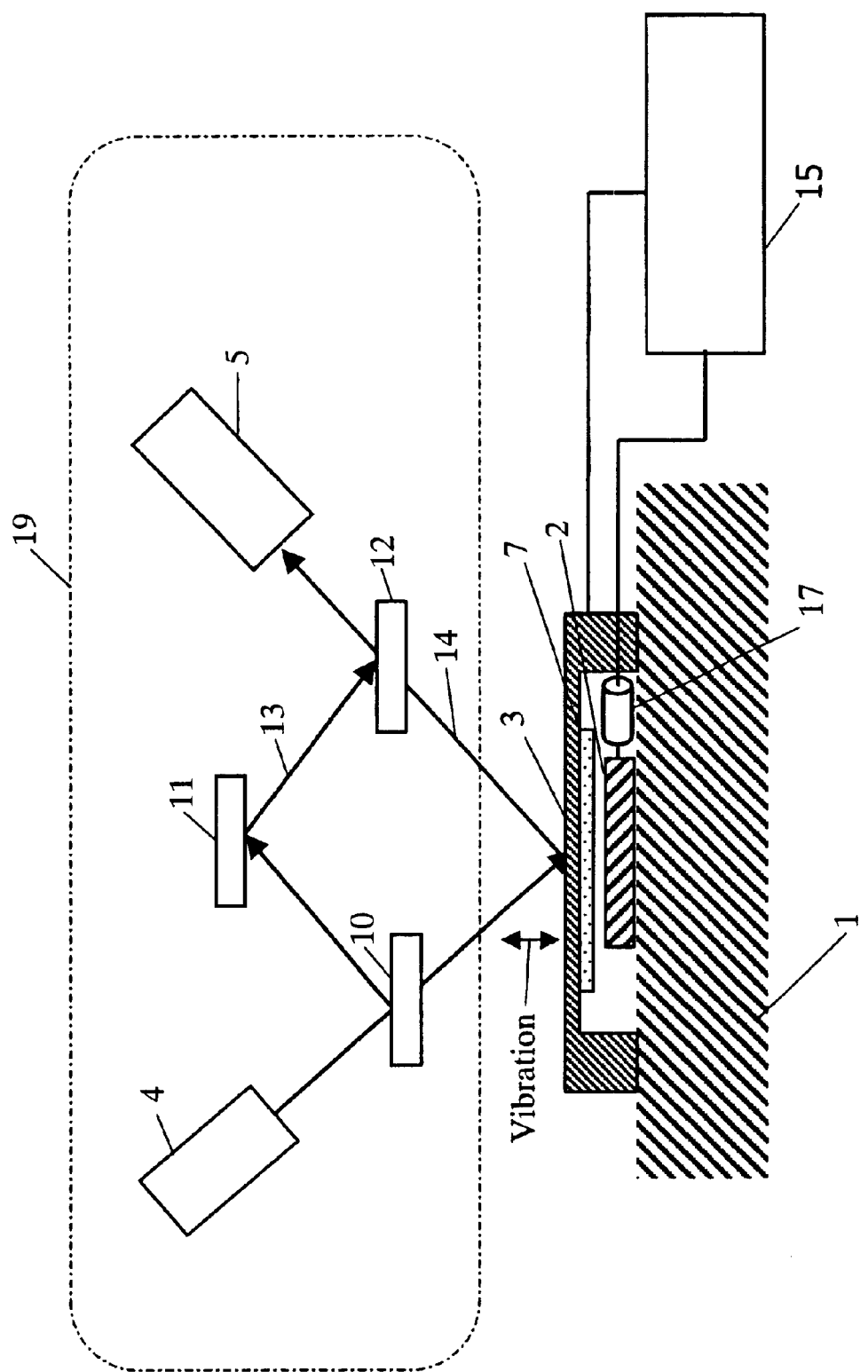
FIG. 1 shows a structure of a filter in accordance with a first exemplary embodiment of the present invention.
Figure 2A:
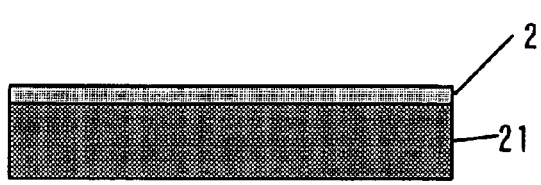
FIG. 2A shows a sectional view illustrating what is done in step 1 of processes forming a resonator in accordance with the first exemplary embodiment.
Figure 2J:
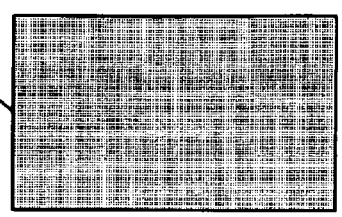
FIG. 2J shows a front view illustrating what is done in step 1 of processes forming the resonator in accordance with the first exemplary embodiment.
Figure 2B:
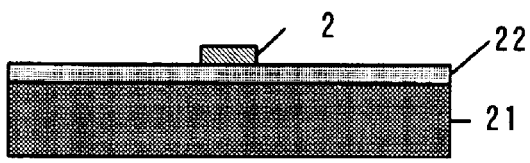
FIG. 2B shows a sectional view illustrating what is done in step 2 of processes forming the resonator in accordance with the first exemplary embodiment.
Figure 2K:
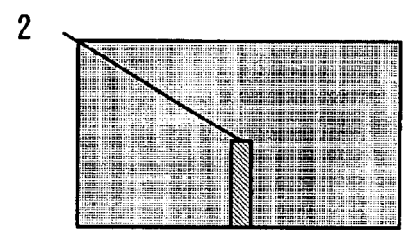
FIG. 2K shows a front view illustrating what is done in step 2 of processes forming the resonator in accordance with the first exemplary embodiment.
Figure 2C:
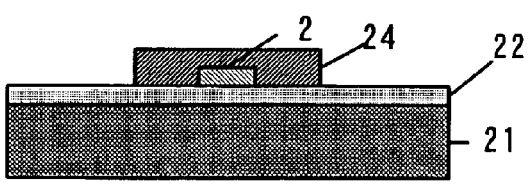
FIG. 2C shows a sectional view illustrating what is done in step 3 of processes forming the resonator in accordance with the first exemplary embodiment.
Figure 2L:
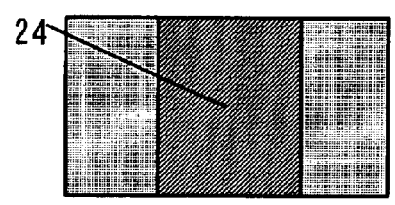
FIG. 2L shows a front view illustrating what is done in step 3 of processes forming the resonator in accordance with the first exemplary embodiment.
Figure 2D:
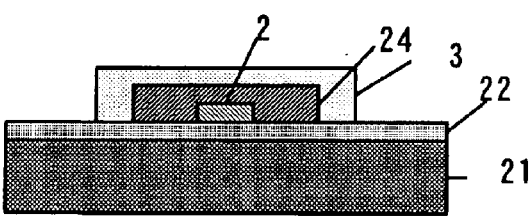
FIG. 2D shows a sectional view illustrating what is done in step 4 of processes forming the resonator in accordance with the first exemplary embodiment.
Figure 2M:
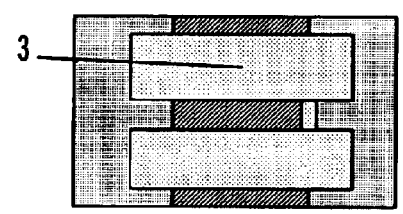
FIG. 2M shows a front view illustrating what is done in step 4 of processes forming the resonator in accordance with the first exemplary embodiment.
Figure 2E:
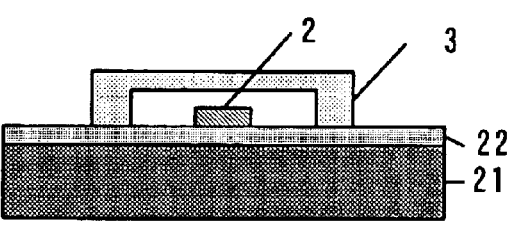
FIG. 2E shows a sectional view illustrating what is done in step 5 of processes forming the resonator in accordance with the first exemplary embodiment.
Figure 2N:
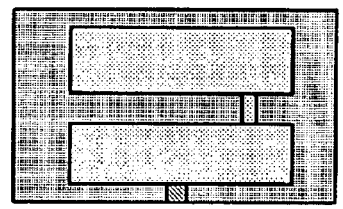
FIG. 2N shows a front view illustrating what is done in step 5 of processes forming the resonator in accordance with the first exemplary embodiment.

FIG. 1 shows a schematic structure of a filter in accordance with the first exemplary embodiment of the present invention. The filter of the present invention includes input line 2, disposed on substrate 1, for receiving an electric signal, and resonator 3 equipped with dielectric layer 7 closely above input line 2. The atmospheric pressure is kept at vacuum or substantially vacuum condition not more than 100 pascal using a decompression package which is omitted in FIG. 1. The structure including a decompression package will be described later.

Laser source 4 launches a beam of light onto the surface of resonator 3 via half mirror 10, and photo detector 5 receives detected light 14 from the surface of resonator 3 via half-mirror 12. Half mirror 10 splits the light beam from laser source 4 and permits some of the light beam as reference light 13 to travel to light detector 5 via mirror 11 and half mirror 12. DC control unit 15 controls a direct potential between resonator 3 and input line 2 via inductor 17, thereby changing the resonance frequency of resonator 3.

Mechanical vibration detector 19 is formed of laser source 4, half mirrors 10, 12, mirror 11 and photo detector 5. An electric signal fed into input line 2 includes a desirable signal and other unnecessary signals. When the electric signal fed into input line 2 substantially agrees with the resonance frequency of resonator 3, resonator 3 is excited to vibrate.

The vibration of resonator 3 is detected by, e.g., an interference measuring method based on a laser heterodyne system using laser beam. To be more specific, a laser beam launched from laser source 4 is split into two, and one beam strikes resonator 3, and the other strikes half mirror 12 via mirror 11 as reference light 13. Detected light 14 reflected from resonator 3 interferes with reference light 13 at half mirror 12, and the interfered light is received at light detector 5.

A vibration of resonator 3 changes an optical path length of detected light 14, so that an optical path difference between detected light 14 and reference light 14 changes. When respective optical path lengths are equal to each other or the optical path difference is an integral multiple of the wavelength, the amplitude of the interfered light becomes the maximum. When the optical path length equals to an odd multiple of the half wavelength, both the lights cancel with each other, so that the amplitude of the interfered light becomes the minimum. Then measurement of intensity of the signal received at photo detector 5 allows measuring a change of the optical path difference, namely, the vibrations of resonator 3.

DC control unit 15 applies a direct potential between resonator 3 and input line 2, then electrostatic force works between resonator 3 and line 2, thereby bowing resonator 3, and this bowing changes spring constant k of resonator 3. Thus the resonance frequency f0 changes as per the equation shown in the prior art. Therefore, control unit 15 regulates the direct potential applied, so that a center frequency of a pass-band is regulated.

A filter (not shown) formed by arranging plural resonators in parallel, having identical resonance frequency f0, can increase a coupling area between an input line and a resonator, thereby reinforcing the coupling strength, and on top of that, changing an input impedance of the input line.

Next, steps of manufacturing resonator 3 are demonstrated with reference to FIGS. 2A–2E (sectional views) and 2J–2N (top views).

Step 1: Deposit nitride layer 22 on high-resistive Si substrate 21 with a thickness of 200 nm by a decompression chemical vapor deposition (CVD) method.

Step 2: Deposit aluminum on the entire face of silicon nitride layer 22 with a thickness of 1 µm by sputtering. Carry out patterning with photo resist such that the resist remains in the area where input line 2 is formed. Carry out aluminum dry etching with the photo resist as a mask, thereby forming input line 2.

Step 3: Deposit silicon oxide layer 24 as a sacrificial layer by a decompression CVD method. The thickness of the sacrificial layer formed on input line 2 is later to be a gap between input line 2 and resonator 3, thus deposit the silicon oxide layer 24 up to a desirable thickness on input line 2. For instance, deposit the silicon oxide layer 24 by 100 nm, then mask a given area with the photo resist, and carry out etching on unnecessary area using a reactive ion etching method (RIE) for forming silicon oxide layer 24 only on the given area.

Step 4: Deposit poly-silicon by the decompression CVD method, and carry out etching on unnecessary area for leaving a given area, where resonator 3 is to be formed, using a reactive ion etching method (RIE).

Step 5: Finally, carry out wet-etching for removing silicon oxide layer 24, so that resonator 3 becomes hollow.

In this first embodiment high-resistive Si substrate 21 is used; however, this does not limit the present invention, and an ordinary Si substrate, a compound semiconductor substrate, or a substrate made of insulating material can be used.

In this embodiment input line 2 made from aluminum is used; however, the input line can be made from other metals such as Mo, Ti, Au, Cu, or semiconductor materials such as amorphous silicon that includes impurity at a high density, or conductive high-polymer materials.

In this embodiment a sputtering method is used for forming a layer; however, a CVD method, or a plating method can be used instead. A surface of resonator 3 can coated with Au or Al having a high reflectance in order to increase reflection efficiency of light.

In this embodiment, interfered light is used for measuring a position of resonator 3; however, any method that can measure the vibration of the resonator can be used. For instance, place an electrode close to a resonator, and apply a voltage between the electrode and the resonator, then a tunnel current runs responsive to a gap therebetween. A method of measuring this tunnel current can be used. An interatomic microscope, which observes peaks and valleys on a surface, uses interatomic force. This interatomic force or intermolecular force can be used for measuring the vibration of the resonator.

Resonator 3 in accordance with the first embodiment works properly in high frequencies such as MHz band or GHz band. For this purpose, resonator 3 is downsized to a micro-body. In order to avoid degradation of factor Q due to viscosity of air, resonator 3 is used in vacuum or a substantially vacuum condition not more than 100 pascal.

A decompression package of highly air-tight is thus necessary for resonator 3 to work properly. However, since the vibration of resonator 3 is detected using interfered light, the decompression package should be made of the material that transmits the light irradiating resonator 3 or the light reflected from resonator 3. The whole package is not necessarily made of light transmissible material, but windows that transmit the light can be prepared at only necessary parts of the package.

FIG. 3 shows a sectional view illustrating the resonator in accordance with this embodiment, and the resonator is accommodated in the decompression package of highly airtight. Resonator 3 is placed on silicon nitride layer 22 deposited on high-resistive Si substrate 21. Resonator 3 is then housed in decompression package 26 that has windows 18 transmitting laser beam and maintains vacuum or substantially vacuum condition therein. Windows 18 can be made of, e.g., quartz.

From another view of point, the filter used in this embodiment works as an optical modulator which modulates the laser beam with an electric signal fed into the input line via the mechanical vibration of the resonator. Therefore, the filter in accordance with the first embodiment can be used as an optical modulator.

Exemplary Embodiment 2

Figure 4:
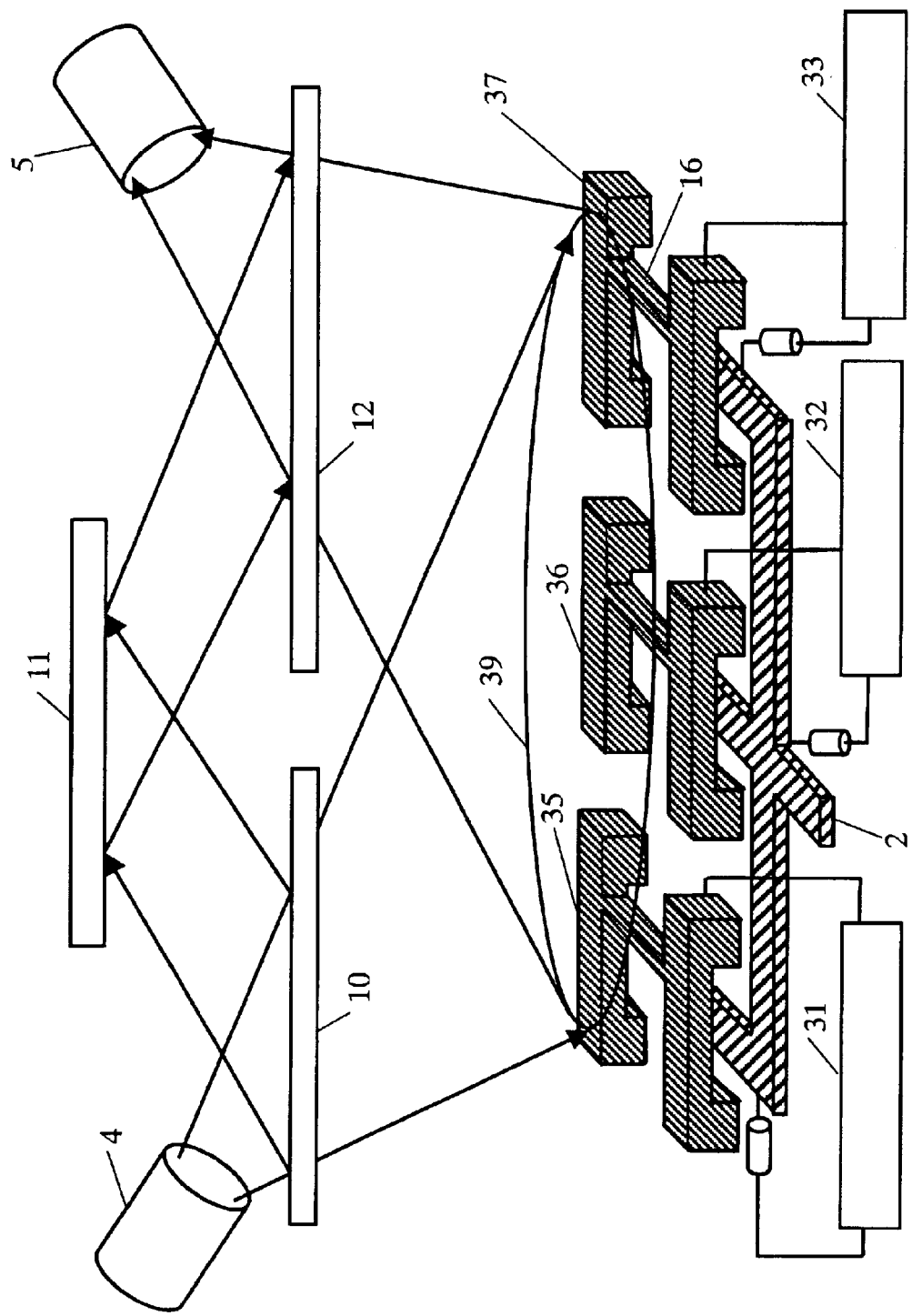
FIG. 4 shows a schematic structure of a filter in accordance with a second exemplary embodiment.

FIG. 4 shows a schematic structure of a filter in accordance with the second exemplary embodiment. In FIG. 4, elements similar to those in FIG. 1 have the same reference marks, and the descriptions thereof are omitted here. A decompression package is omitted in FIG. 4; however, the filter can work in a similar way to that described in FIG. 3. This second embodiment describes the filter having selectable three different resonance frequencies.

In the filter, resonator 35 having resonance frequency f1, resonator 36 having resonance frequency f2, and resonator 37 having resonance frequency f3 are placed in parallel with respect to input line 2. Respective resonators 35, 36 and 37 are formed of two sub-resonators by a coupling means. First DC control unit 31 controls resonator 35, second DC control unit 32 controls resonator 36, and third DC control unit 33 controls resonator 37.

Laser source 4 irradiates resonators 35, 36 and 37 with laser beam via half mirror 10, and the irradiating area is defined as single beam spot 39.

An electric signal fed into input line 2 is supplied to three resonators 35, 36, 37 evenly, and when the input electric signal generally agrees with any one of the resonance frequencies f1, f2 and f3, the resonator having the agreeing resonance frequency is excited to vibrate, thereby converting the electric signal to mechanical vibrations.

For detecting the mechanical vibrations, the same method as used in the first embodiment can be adopted. However, a use of material, which can directly detect an optical phase, as photo detector 35 allows irradiating directly resonators 35, 36 and 37 with laser beam, and photo detector 35 can receive the reflected light from the resonators.

For instance, vibration of resonator 35 changes an optical path length, so that a phase of the signal of the received light changes. Laser source 4, having frequency f4 and wavelength $\lambda$, launches signal $\mathrm{Sin}(f4 \times t)$, and the light reflected from resonator 35 that includes signal $\mathrm{Sin}(f4 \times t + \Delta\phi)$ is received at photo detector 5. Phase difference $\Delta\phi$ changes due to an occurrence of optical path difference $\Delta y$, i.e., displacement of resonance amplitude of resonator 35, so that $\Delta\phi = \Delta y/\lambda$ is held.

The foregoing mechanism allows extracting only the signals that have passed through a desirable band, namely, frequency f1 of resonator 35. Resonators 36 and 37 work in a similar way. In this second embodiment, since photo detector 5 simultaneously receives vibrations generated by the respective resonance frequencies of the resonators, it is necessary not to vibrate resonators other than a desirable resonator, or not to detect vibrations other than desirable one.

In this embodiment, resonators 35–37 are irradiated evenly with laser beam, and photo detector 5 receives the reflected light. In this case, resonators 36 and 37, other than resonator 35 having a desirable resonance frequency f1, are forced to stop vibrating. The forcible stop can be done by applying direct potential from DC control units 32, 33 so that electrostatic force is applied to resonators 36, 37. As a result, resonators 36, 37 are brought into contact with input line 2, and resonators 36, 37 do not vibrate.

At this time, a dielectric layer (not shown) between resonators 36, 37 and line 2 prevents a dc from running. Since desirable resonator 35 only vibrates, the signal received by photo detector 5 contains only the vibration information of resonator 35.

Figure 5:
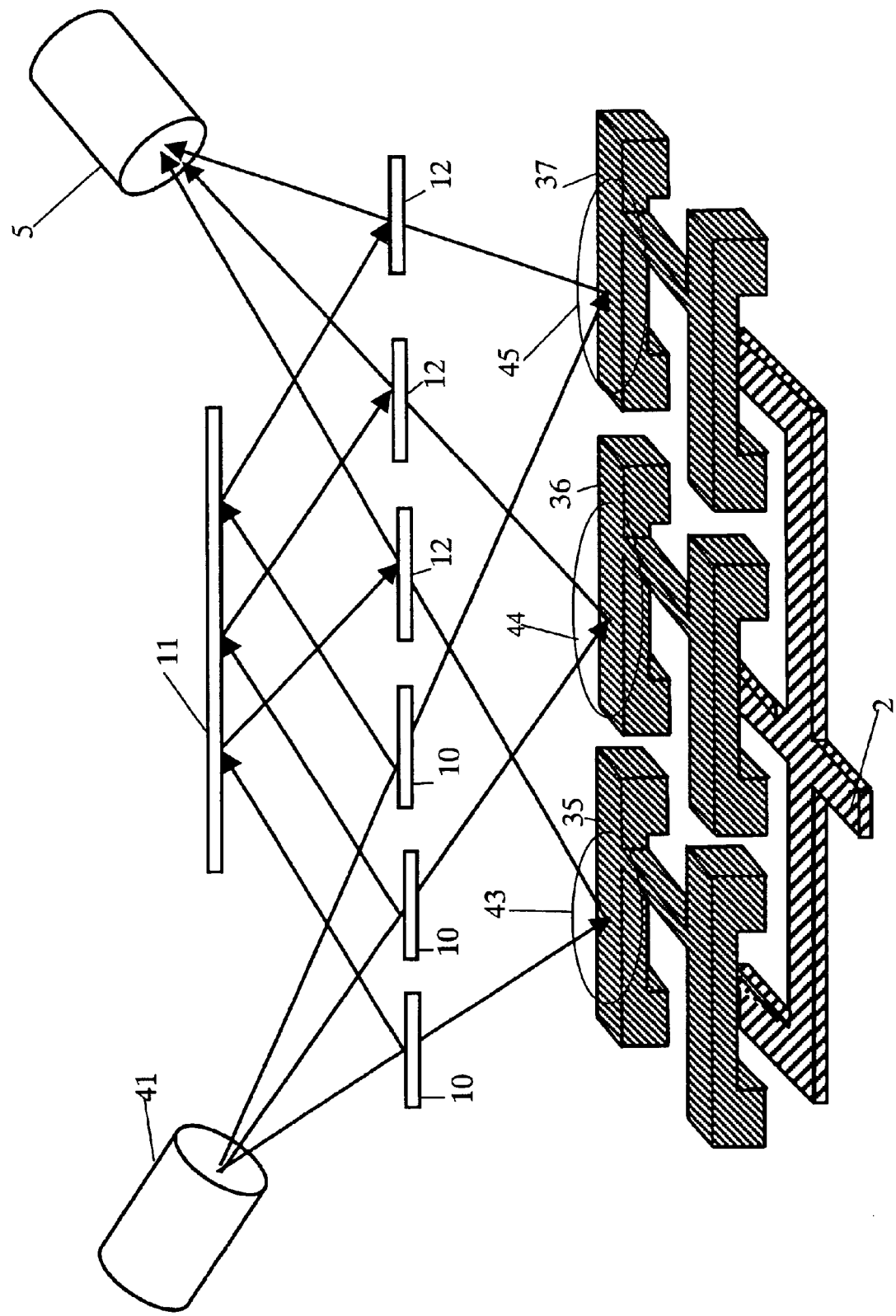
FIG. 5 shows a schematic structure illustrating a multi-beam is used in a laser source of the filter in accordance with the second embodiment.

As shown in FIG. 5, multi-beam is used in laser source 41 so that source 41 can be switched, and for instance, laser source 41 irradiates only desirable resonator 35 as multi-beam spot 43 with laser beam. Source 41 can also irradiate resonator 36, 37 by switching multi-beam spot 44, 45 with laser beam. A decompression package is omitted in FIG. 5; however, this embodiment can be carried out in the same structure as that used in FIG. 3.

As discussed above, laser source 41 is switched to irradiate a desirable resonator with laser beam, so that the photo detector receives the signal only from the desirable filter. As a result, the signal of high SIN ratio is obtainable. In stead of laser source 41 using the multi-beam, a laser source using a single-beam (not shown) can be linked to a movable mirror, thereby irradiating resonators 35–37 with a switchable single beam.

In this second embodiment, half mirrors 10, 12 are not necessarily formed of plural mirrors respectively, and half mirrors 10, 12 may be movable so that the numbers of mirrors are reduced. Three resonators are used in this embodiment; however, the present invention is not limited to this number and any quantity of mirrors can be used.

Exemplary Embodiment 3

FIG. 6A is a top view illustrating a schematic structure of a filter in accordance with the third exemplary embodiment of the present invention. FIG. 6B shows a sectional view of the same item shown in FIG. 6A. The sectional view is taken along alternate long and short dash line a1–a2 in FIG. 6A. In FIGS. 6A and 6B, elements similar to those in FIG. 1 have the same reference marks and the descriptions thereof are omitted here. A decompression package is omitted in FIGS. 6A and 6B; however, this embodiment can be carried out in the same structure as that used in FIG. 3. In this embodiment, resonator 3 and input line 2, both similar to those in the first embodiment, are formed on silicon nitride layer 22 deposited on high-resistive Si substrate 21.

In high-resistive Si substrate 21, input wave-guide 47 and output wave-guide 48 are formed for guiding laser beam that is used for measuring the vibration of resonator 3. Just under resonator 3, input wave-guide 47 and output wave-guide 48 are obliquely cut off, so that the laser beam traveling through input wave-guide 47 is refracted vertically with respect to substrate 21 and launched from substrate 21. Then the laser beam strikes resonator 3 via half mirror 10.

The laser beam incident onto resonator 3 is reflected as detected light, and strikes half mirror 11 together with reference light arrived on mirror 11. The laser beam is thus interfered is returned to substrate 21 at a place, where output wave-guide 48 is placed. When resonator 3 resonates and vibrates, a phase of a signal received in the output wave-guide is changed, so that the vibration information of resonator 3, namely, the information of the input high frequency signal can be obtained.

Figure 7A:
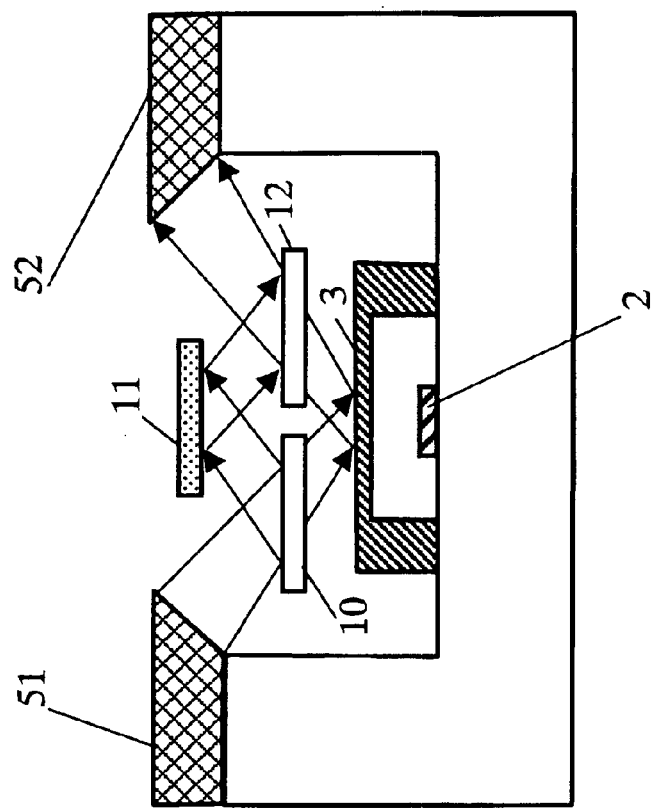
FIG. 7A shows a top view illustrating another schematic structure of a filter in accordance with the third embodiment.
Figure 7B:
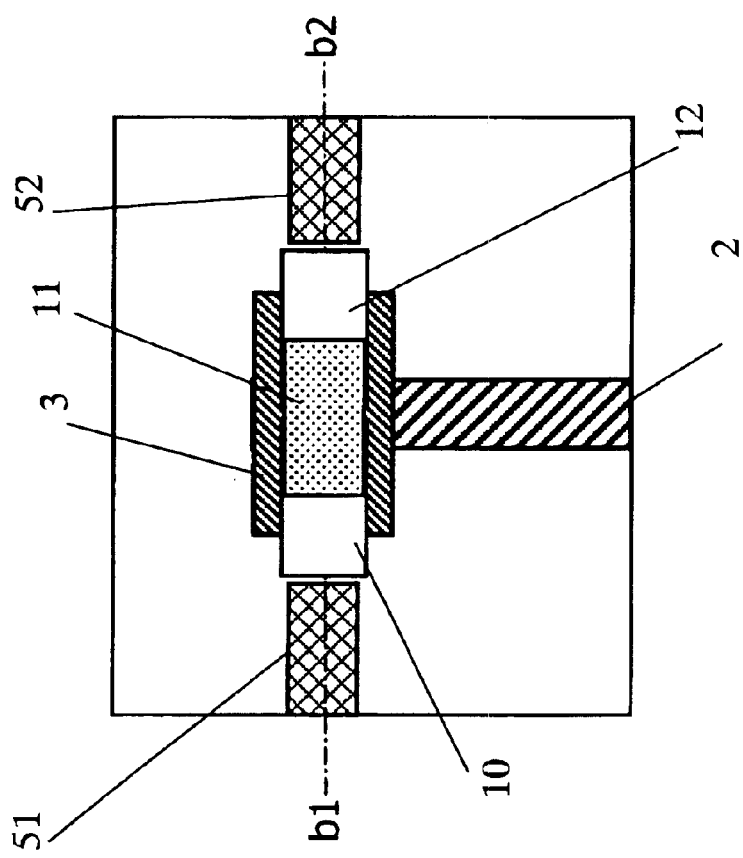
FIG. 7B shows a sectional view illustrating another schematic structure of a filter in accordance with the third embodiment.
Figures 8A, 8B:
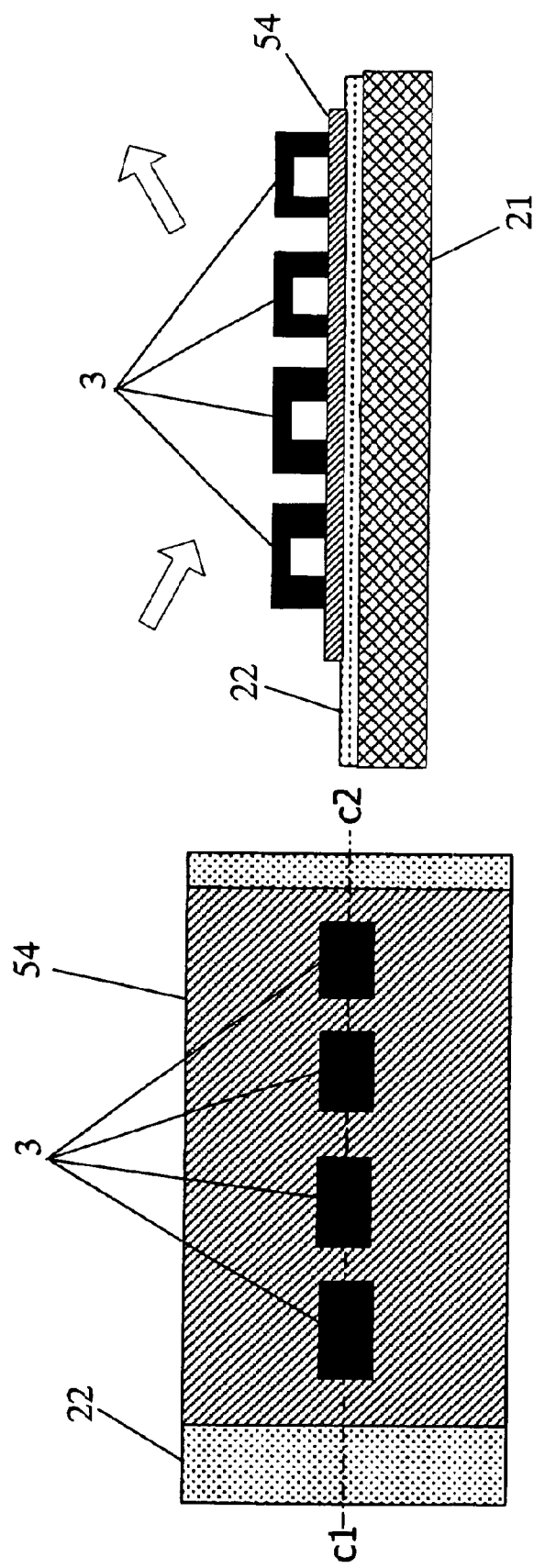
FIG. 8A shows a top view illustrating a placement of resonators in accordance with a fourth exemplary embodiment.
FIG. 8B shows a sectional view illustrating the placement of the resonators in accordance with the fourth embodiment.

The wave-guide is not necessarily formed on substrate 21 under resonator 3, and as shown in FIGS. 7A, 7B, input wave-guide 51, output wave-guide 52 can be prepared above resonator 3 at the place where the laser beam is irradiated. The sectional view is taken along alternate long and short dash line b1–b2 of the top view. A decompression package is omitted in FIGS. 7A, 7B; however, the filter can work in the same way as described in FIG. 3.

Exemplary Embodiment 4

FIGS. 8A, 8B, 9A and 9B show placements of resonators in accordance with the fourth exemplary embodiment. In those drawings, elements similar to those in FIG. 1 have the same reference marks and the descriptions thereof are omitted here. The sectional view is taken along long and short dash line c1–c2 in the top view. A decompression package is omitted in FIGS. 8A, 8B, 9A and 9B; however, the filter can work in a similar way to that described in FIG. 3.

In this fourth embodiment, resonators 3 used in the first embodiment are basically arranged in an array on silicon nitride layer 22 deposited on high-resistive substrate 21. Input lines 2 are not placed just under individual resonators 3, but resonators 3 are placed on, e.g., micro-strip line 54. In a similar structure to the optical system employed in the second embodiment, the laser source (not shown) launches laser beam, and the reflected laser beam from vibrating resonator 3 is received by a photo detector (not shown), so that changes of the reflected laser beam can be detected.

Figure 9B:
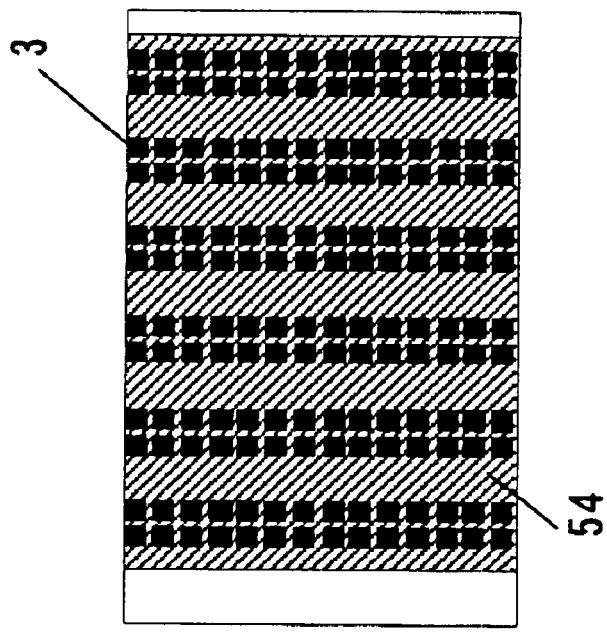
FIG. 9B shows resonators placed like a diffraction grating in accordance with the fourth embodiment.
Figure 9A:
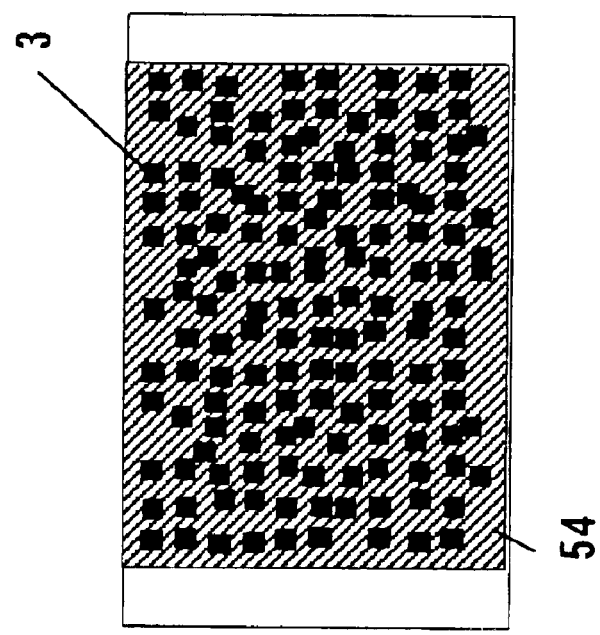
FIG. 9A shows a random placement of resonators in accordance with the fourth embodiment.

The foregoing placement can work in higher frequencies, and downsized resonator 3 can be advantageously used in this placement over other resonators. As shown in FIG. 9A, the resonators can be placed random, or as shown in FIG. 9B, the resonators can be placed in an optically significant shape. If positioning of the resonators cannot be controlled, the random placement as shown in FIG. 9A is used.

The individual resonators of micro-body are placed in stripes as shown in FIG. 9B, so that a diffraction grating can be formed, which allows diffracted light to radiate in a specific direction. In this case, the diffracted light can be radiated in a specific direction, thereby increasing an efficiency of collecting lights.

Exemplary Embodiment 5

Figure 10C:
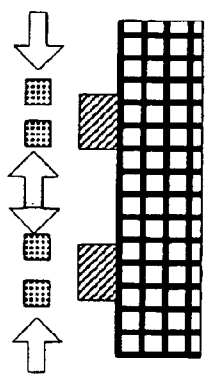
FIG. 10C shows a sectional view illustrating a case where an input signal is available in accordance with the fifth embodiment.
Figure 10D:
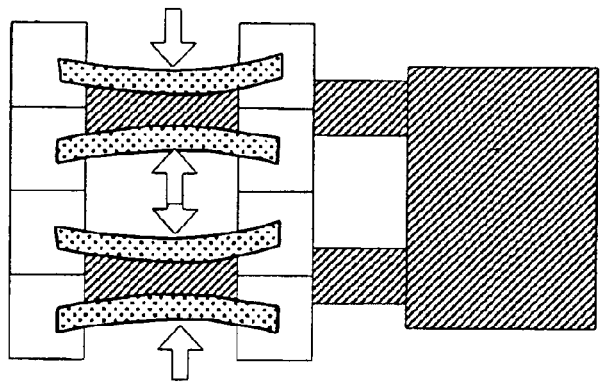
FIG. 10D shows a top view illustrating the case where an input signal is available in accordance with the fifth embodiment.
Figure 10A:
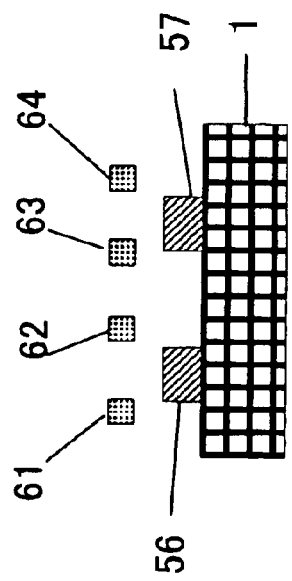
FIG. 10A shows a sectional view illustrating a case where no input signal is available in accordance with a fifth exemplary embodiment.
Figure 10B:
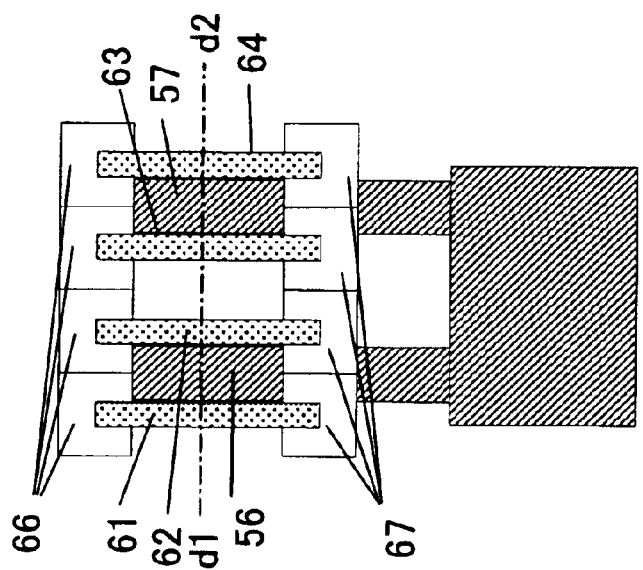
FIG. 10B shows a top view illustrating the case where no input signal is available in accordance with the fifth exemplary embodiment.
Figure 11:
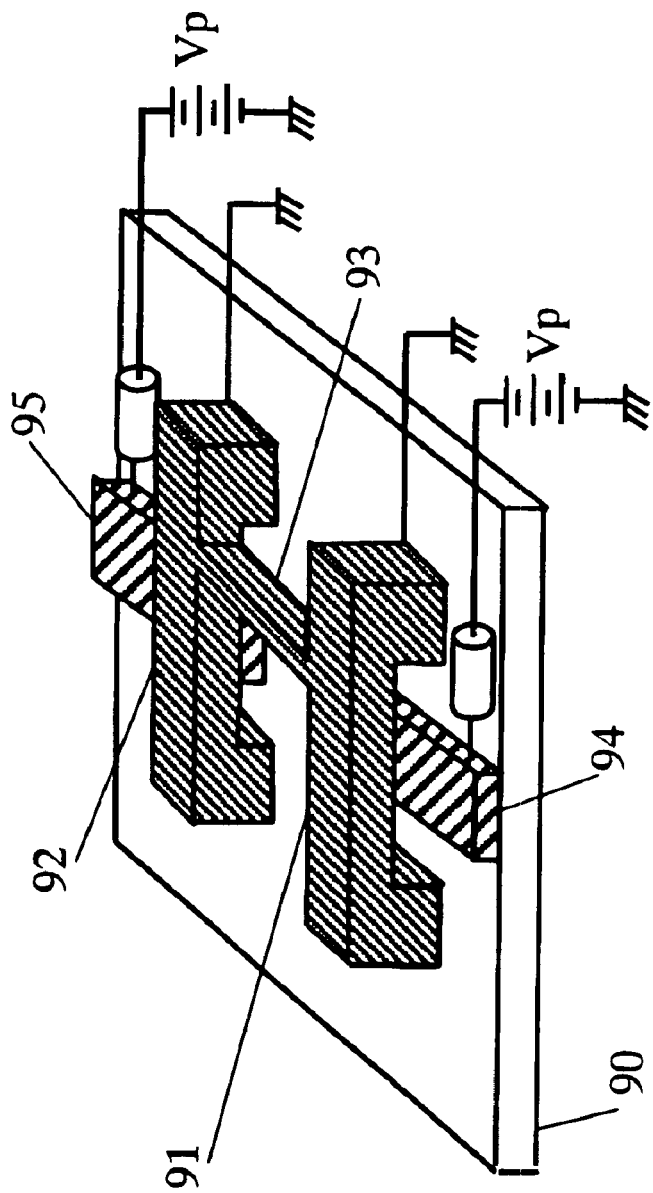
FIG. 11 shows a structure of a conventional filter.
Figure 12:
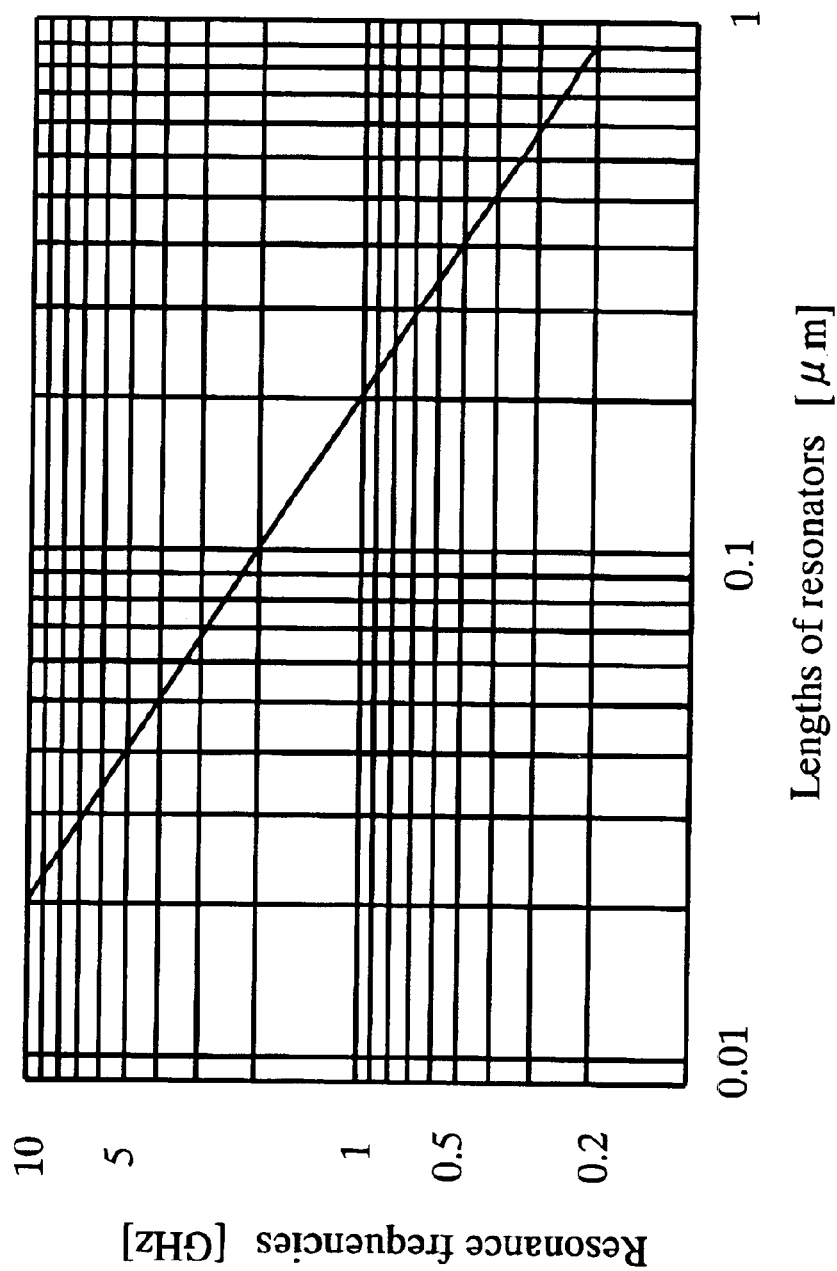
FIG. 12 shows relations between sizes of conventional filters and resonance frequencies.
Figure 13B:
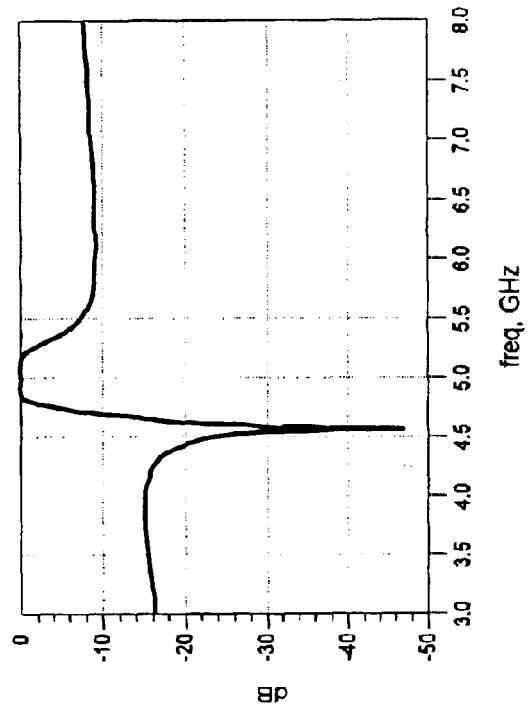
FIG. 13B shows isolation characteristics of a conventional filter where a coupling between input and output is available.
Figure 13A:
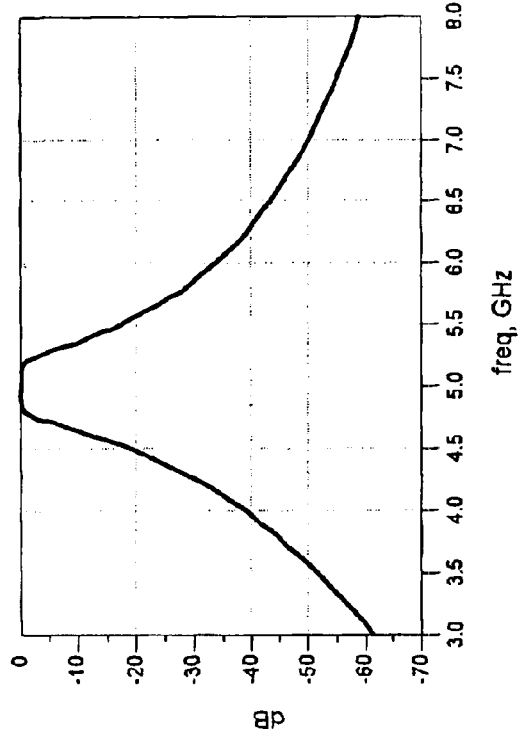
FIG. 13A shows isolation characteristics of a conventional filter where a coupling between input and output is negligible.

FIGS. 10A–10D show sectional views and top views of filters in accordance with the fifth exemplary embodiment of the present invention. The sectional view is taken along long and short dash line d1–d2 in the top view. At least two resonators are necessary for this embodiment, and four resonators are used for the description purpose. A decompression package is omitted in FIGS. 10A, 10B, 10C and 10D; however, the filter can work in a similar way to that described in FIG. 3. Four resonators 61, 62, 63, and 64 are equidistantly placed from each other like bridges on fixed stands 66, 67 with their both ends rigidly mounted on stands 66, 67. As shown in FIG. 10A, two input lines 56, 57 are placed between resonators 61 and 62 as well as between resonators 63 and 64 in parallel with respect to respective resonators 61–64, which vibrate in horizontal direction.

When a signal is fed into input line 56, electrostatic force of the signal running through input line 56 excites resonators 61, 62 horizontally. Since resonators 61, 62 are equidistant from input line 56 symmetrically, they vibrate in an identical amplitude; however, they vibrate in reversal phase to each other. Therefore, a relative displacement amount between resonators 61, 62 is twice as much as a vibration amount of a single resonator with the same input high-frequency signal.

Resonators 63, 64 vibrate with respect to input line 57 in the same way. A use of resonators 61–64 as a diffraction grating produces a displacement two times as much as the case where the same signal is used, so that the higher sensitive mechanical vibration can be detected.

As discussed above, the filter of the present invention can prevent a coupling between an input line and an output line in high frequencies such as MHz band or GHz band, and also can prevent the characteristics of the filter from being degraded by viscosity of air.

What is claimed is:

1. A filter comprising:
  (a) a line to which an electric signal is fed into;
  (b) a resonator, disposed in vacuum and closely to said line, for resonating by electrostatic force generated in response to a frequency of the electric signal;
  (c) detecting means for detecting mechanical vibrations of said resonator, and
  (d) a dielectric layer between said resonator and said line;
  wherein said detecting means converts the mechanical vibrations into a signal different from the electric signal for the mechanical vibrations to be detected.

2. The filter of claim 1, wherein said resonator is equipped with DC control means which applies a direct potential between said line and said resonator for controlling operation of said resonator.

3. The filter of claim 1, wherein the signal different from the electric signal is at least one of interfered light produced by interference between reference light and detected light reflected from said resonator, a tunnel current running between an electrode disposed closely to said resonator and said resonator, inter-molecular force between the electrode disposed closely to said resonator and said resonator, and inter-atomic force between the electrode disposed closely to said resonator and said resonator.

4. The filter of claim 3, wherein the interfered light is interfered with a laser beam using a laser heterodyne method.

5. The filter of claim 3, wherein the reference light is irradiated to a selected resonator via a movable mirror which can change a reflecting direction.

6. The filter of claim 3, wherein the interfered light is further converted into an electric signal via a wave-guide.

7. A filter comprising:
  (a) a line to which an electric signal is fed into;
  (b) a resonator, disposed in vacuum and closely to said line, for resonating by electrostatic force generated in response to a frequency of the electric signal; and
  (c) detecting means for detecting mechanical vibrations of said resonator,
  wherein said detecting means converts the mechanical vibrations into a signal different from the electric signal for the mechanical vibrations to be detected, and said resonator has a longer side whose length is shorter than a width of said line.

8. The filter of claim 7, wherein a plurality of said resonators are coupled together sequentially in parallel with respect to said line and said detecting means, and the plurality of said resonators have an identical resonance frequency.

9. The filter of claim 7, wherein a plurality of said resonators are coupled to each other in parallel with respect to said line and said detecting means, and the plurality of said resonators have a resonance frequency different from each other.

10. The filter of claim 7, wherein said resonator is equipped with DC control means which applies a direct potential between said line and said resonator for controlling operation of said resonator.

11. The filter of claim 7 further comprising a dielectric layer between said resonator and said line.

12. The filter of claim 7, wherein the signal different from the electric signal is at least one of interfered light produced by interference between reference light and detected light reflected from said resonator, a tunnel current running between an electrode disposed closely to said resonator and said resonator, inter-molecular force between the electrode disposed closely to said resonator and said resonator, and inter-atomic force between the electrode disposed closely to said resonator and said resonator.

13. The filter of claim 12, wherein the interfered light is interfered with a laser beam using a laser heterodyne method.

14. The filter of claim 12, wherein the reference light is irradiated to a selected resonator via a movable mirror which can change a reflecting direction.

15. The filter of claim 12, wherein the interfered light is further converted into an electric signal via a wave-guide.

16. The filter of claim 7, wherein a plurality of said resonators, having a longer side whose length is shorter than the width of said line, are arranged in a diffraction grating shape.

17. A filter comprising:
  (a) a line to which an electric signal is fed into;
  (b) a resonator, disposed in vacuum and closely to said line, for resonating by electrostatic force generated in response to a frequency of the electric signal; and
  (c) detecting means for detecting mechanical vibrations of said resonator,
  wherein said detecting means converts the mechanical vibrations into a signal different from the electric signal for the mechanical vibrations to be detected, and a plurality of said resonators are coupled to each other in parallel with respect to said line and said detecting means, and the plurality of said resonators have a resonance frequency different from each other.

18. The filter of claim 17, wherein said resonators are equipped with DC control means respectively, which applies a direct potential between said line and said resonators for controlling operation of said resonators.

19. The filter of claim 17 further comprising a dielectric layer between said resonators and said line.

20. The filter of claim 17, wherein the signal different from the electric signal is at least one of interfered light produced by interference between reference light and detected light reflected from said resonator, a tunnel current running between an electrode disposed closely to said resonator and said resonator, inter-molecular force between the electrode disposed closely to said resonator and said resonator, and inter-molecular force between the electrode disposed closely to said resonator and said resonator.

21. The filter of claim 20, wherein the interfered light is interfered with a laser beam using a laser heterodyne method.

22. The filter of claim 20, wherein the reference light is irradiated to a selected resonator via a movable mirror which can change a reflecting direction.

23. The filter of claim 20, wherein the interfered light is further converted into an electric signal via a wave-guide.

24. A filter comprising:
  (a) a line to which an electric signal is fed into;
  (b) a resonator, disposed in vacuum and closely to said line, for resonating by electrostatic force generated in response to a frequency of the electric signal; and
  (c) detecting means for detecting mechanical vibrations of said resonator,
  wherein said detecting means converts the mechanical vibrations into a signal different from the electric signal for the mechanical vibrations to be detected, and a plurality of resonators are coupled to each other in parallel with respect to said detecting means, and said plurality of resonators have an identical resonance frequency, and said plurality of resonators are placed along both ends of said line in pairs.

* * * * *